(12) United States Patent
Lee

(10) Patent No.: US 11,195,087 B2
(45) Date of Patent: Dec. 7, 2021

(54) SYNAPSE ARRAY OF A NEUROMORPHIC DEVICE INCLUDING A SYNAPSE ARRAY HAVING A PLURALITY OF FERROELECTRICITY FIELD EFFECT TRANSISTORS

(71) Applicant: SK hynix Inc., Icheon (KR)

(72) Inventor: Hyung-Dong Lee, Hwaseong-si (KR)

(73) Assignee: SK HYNIX INC., Icheon-si (KR)

( * ) Notice: Subject to any disclaimer, the term of this patent is extended or adjusted under 35 U.S.C. 154(b) by 1021 days.

(21) Appl. No.: 15/850,145

(22) Filed: Dec. 21, 2017

(65) Prior Publication Data

US 2018/0349762 A1  Dec. 6, 2018

(30) Foreign Application Priority Data

Jun. 5, 2017 (KR) .................. 10-2017-0069563

(51) Int. Cl.
| | |
|---|---|
| *G06N 3/063* | (2006.01) |
| *G06N 3/04* | (2006.01) |
| *H01L 27/1159* | (2017.01) |
| *H01L 27/11587* | (2017.01) |
| *H01L 27/1156* | (2017.01) |
| *H01L 29/51* | (2006.01) |
| *H01L 27/11521* | (2017.01) |
| *H01L 29/66* | (2006.01) |
| *H01L 21/28* | (2006.01) |
| *H01L 29/78* | (2006.01) |
| *H01L 29/423* | (2006.01) |

(52) U.S. Cl.
CPC ............ *G06N 3/063* (2013.01); *G06N 3/04* (2013.01); *H01L 27/1156* (2013.01); *H01L 27/1159* (2013.01); *H01L 27/11521* (2013.01); *H01L 27/11587* (2013.01); *H01L 29/40111* (2019.08); *H01L 29/516* (2013.01); *H01L 29/6684* (2013.01); *G06N 3/049* (2013.01); *H01L 29/4238* (2013.01); *H01L 29/42364* (2013.01); *H01L 29/78391* (2014.09)

(58) Field of Classification Search
CPC .......... G06N 3/063; G06N 3/04; G06N 3/049; H01L 29/4011; H01L 27/11521; H01L 27/1156; H01L 27/11587; H01L 27/1159; H01L 29/516; H01L 29/6684; H01L 29/78391; H01L 29/42364; H01L 29/4238
See application file for complete search history.

(56) References Cited

U.S. PATENT DOCUMENTS

| | | | | | |
|---|---|---|---|---|---|
| 4,874,963 | A | * | 10/1989 | Alspector | ............ G06N 3/0635 706/34 |
| 5,371,835 | A | * | 12/1994 | Akamatsu | ............ G06N 3/0635 706/26 |
| 2002/0185690 | A1 | | 12/2002 | Ueda et al. | |

(Continued)

OTHER PUBLICATIONS

IEEE IEDM10.8.1(2013)_Doped HfO2_J Muller: Ferroelectric Hafnium Oxide: A CMOS-compatible and highly scalable approach to future ferroelectric memories.

*Primary Examiner* — Seahvosh Nikmanesh

(57) ABSTRACT

A neuromorphic device having a synapse array is provided. The synapse array of the neuromorphic device may include an input neuron; an output neuron; and a synapse. The synapse may include a plurality of ferroelectric field effect transistors electrically connected to each other in parallel.

15 Claims, 18 Drawing Sheets

(56) References Cited

U.S. PATENT DOCUMENTS

| | | | |
|---|---|---|---|
| 2015/0049938 A1* | 2/2015 | Han, II | G06K 9/6217 |
| | | | 382/158 |
| 2015/0100532 A1* | 4/2015 | Yamaguchi | G06N 3/063 |
| | | | 706/33 |
| 2017/0365313 A1* | 12/2017 | Augustine | G11C 13/0002 |

* cited by examiner

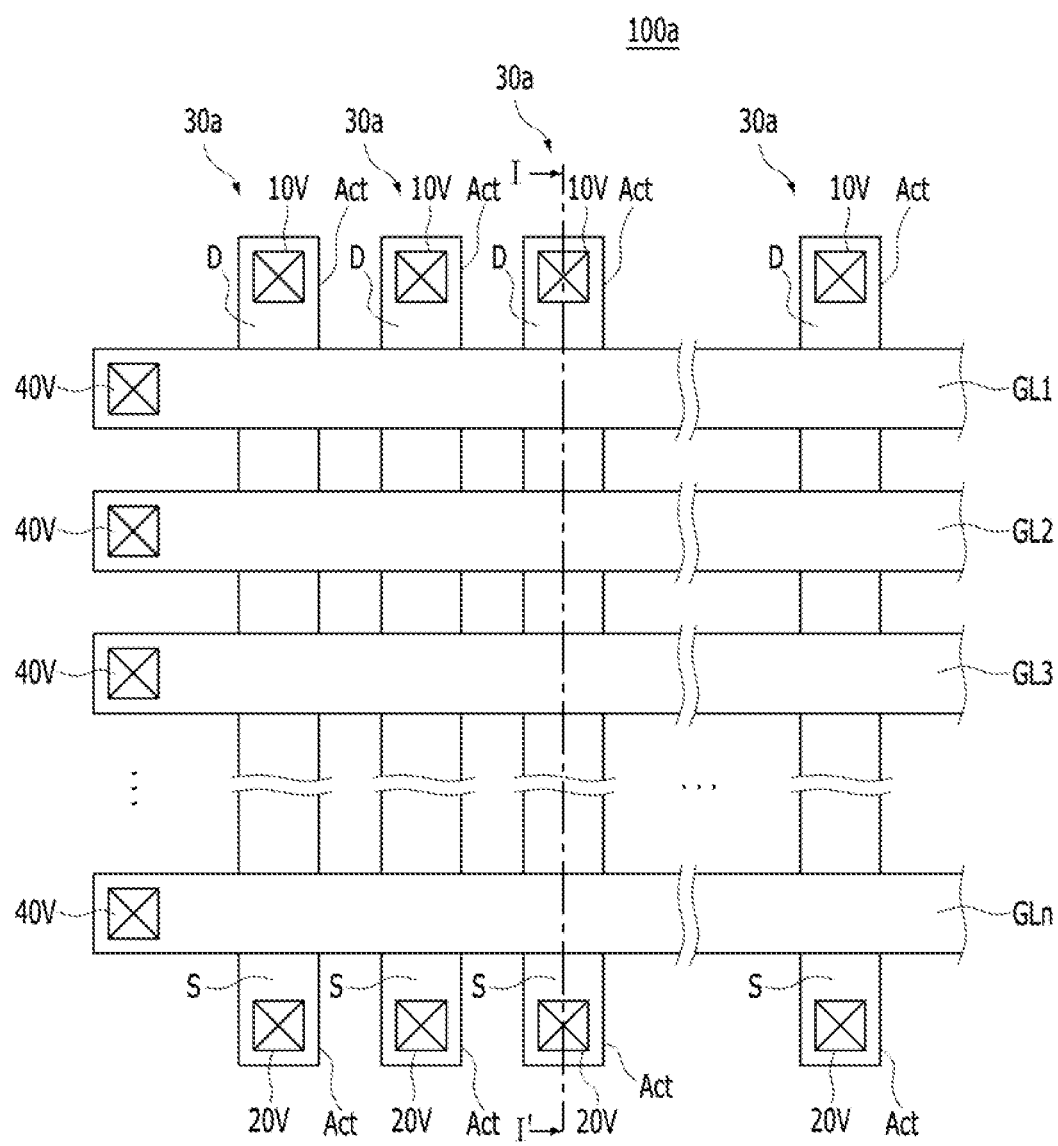

SYNAPSE ARRAY OF A NEUROMORPHIC DEVICE INCLUDING A SYNAPSE ARRAY HAVING A PLURALITY OF FERROELECTRICITY FIELD EFFECT TRANSISTORS

CROSS-REFERENCE TO RELATED APPLICATIONS

The present patent application claims priority under 35 U.S.C. § 119(a) to Korean Patent Application No. 10-2017-0069563, filed on Jun. 5, 2017, which is incorporated herein by reference in its entirety.

BACKGROUND

1. Field

The present disclosure relates to a neuromorphic device and a synapse array of the neuromorphic device having ferroelectric field effect transistors.

2. Description of the Related Art

Recently, much attention has been paid to devices in the field of neuromorphic technology, which use chips that mimic the human brain. A neuromorphic device based on the neuromorphic technology includes a plurality of pre-synaptic neurons, a plurality of post-synaptic neurons, and a plurality of synapses. The neuromorphic device outputs pulses or spikes having various levels, amplitude, and/or times, according to a learning state of the neuromorphic device.

SUMMARY

Embodiments of the present disclosure include a synapse array of a neuromorphic device including a synapse having ferroelectric field effect transistors.

Other embodiments of the present disclosure include a synapse array of a neuromorphic device having a high degree of integration using ferroelectric field effect transistors.

Further embodiments of the present disclosure include a synapse array of a neuromorphic device performing an excitatory synapse operation and an inhibitory synapse operation using ferroelectric field effect transistors.

In accordance with an embodiment of the present disclosure, a synapse array of the neuromorphic device may include an input neuron; an output neuron; and a synapse. The synapse may include a plurality of ferroelectric field effect transistors electrically connected to each other in parallel.

In accordance with the embodiment of the present disclosure, a synapse array of a neuromorphic device may include a first input neuron; a second input neuron; an output neuron; and a synapse. The synapse may include a plurality of pairs of ferroelectric field effect transistors electrically connected to each other in parallel. Each of the plurality of pairs of ferroelectric field effect transistors may include a first ferroelectric field effect transistor and a second ferroelectric field effect transistor. The first ferroelectric field effect transistor and the second field effect transistor may be electrically connected to each other in series.

In accordance with an embodiment of the present disclosure, a synapse array of a neuromorphic device may include an input neuron; an output neuron; a plurality of gating controllers; and a synapse. The synapse may include a ferroelectric field effect transistor having a common gate insulating layer, a common floating gate electrode, a plurality of individual ferroelectric films, and a plurality of individual control gate electrodes.

BRIEF DESCRIPTION OF THE DRAWINGS

FIG. 1C is a layout schematically illustrating the synapse array of the neuromorphic device shown in FIG. 1A.

DETAILED DESCRIPTION

Figure 1A:
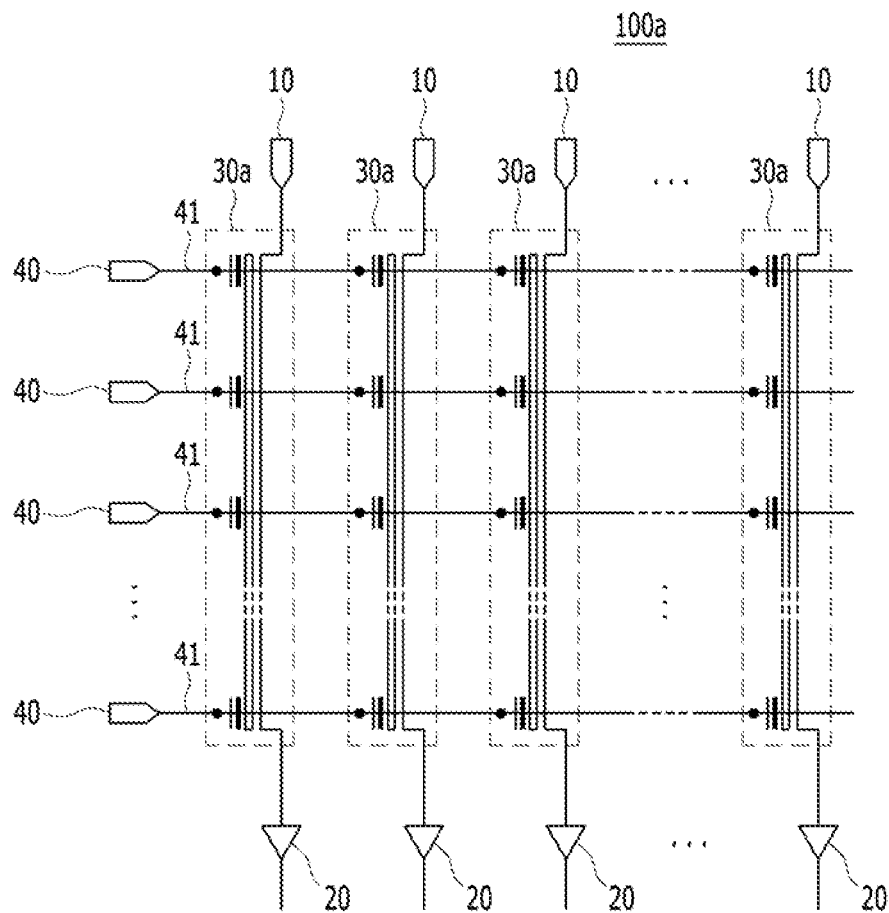
FIG. 1A is a diagram schematically illustrating a synapse array of a neuromorphic device in accordance with an embodiment of the present disclosure.

Various embodiments will be described below in more detail with reference to the accompanying drawings. Embodiments of the present disclosure may, however, have different forms and should not be construed as limited to the embodiments set forth herein. Rather, these embodiments are provided so that this disclosure will be thorough and complete, and will fully convey the scope of the claims to those skilled in the art.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

Figure 1B:
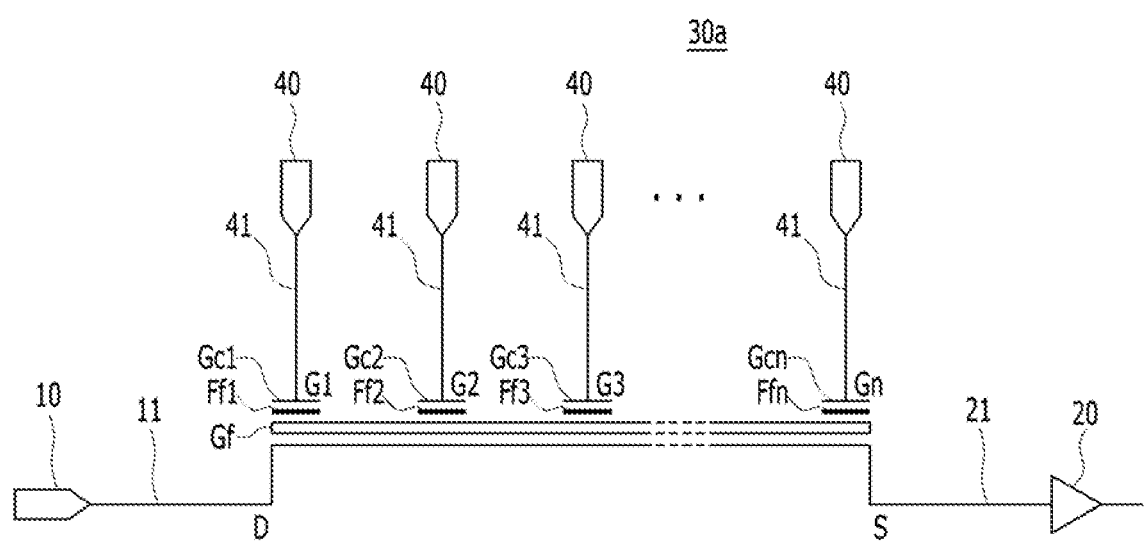
FIG. 1B is a diagram illustrating a synapse in accordance with an embodiment of the present disclosure.

FIG. 1A is a diagram schematically illustrating a synapse array of a neuromorphic device in accordance with an embodiment of the present disclosure, and FIG. 1B is a diagram illustrating a synapse in accordance with an embodiment of the present disclosure.

Referring to FIGS. 1A and 1B, a synapse array 100a of a neuromorphic device in accordance with an embodiment of the present disclosure may include a plurality of input neurons 10, a plurality of output neurons 20, a plurality of gating controllers 40, and a plurality of synapses 30a.

Each of the synapses 30a may include a transistor having a common floating gate electrode Gf, a plurality of individual ferroelectric films Ff1 to Ffn, and a plurality of control gate electrodes Gc1 to Gcn.

The input neuron 10 may be electrically connected to a drain electrode D of the synapse 30a through an input neuron line 11 to provide a first reference voltage to the synapse 30a. For example, the first reference voltage may be a power supply voltage. In an embodiment of the present disclosure, the input neuron 10 may include a pre-synaptic neuron. That is, the input neuron 10 may provide a voltage or current to the synapse 30a. In another embodiment of the present disclosure, the input neuron 10 may provide a pulse-shaped electrical signal to the synapse 30a.

The output neuron 20 may be electrically connected to the source electrode S of synapse 30a through the output neuron line 21 to provide a second reference voltage to the synapse 30a. For example, the second reference voltage may be a ground voltage. In an embodiment of the present disclosure, the output neuron 20 may include a post-synaptic neuron. A voltage or current may be supplied from the synapse 30a to the output neuron 20. Thus, the output neuron 20 may receive and output the synaptic weight of the synapse 30a. In another embodiment of the present disclosure, the output neuron 20 may provide a voltage or current to the synapse 30a.

Referring again to FIG. 1B, the plurality of gating controllers 40 may be electrically connected to the plurality of control gate electrodes Gc1 to Gcn of synapse 30a through a plurality of gating control lines 41, respectively. The gating controllers 40 may partially and independently turn on or turn off transistors in synapse 30a. In the read-out mode, for example, the plurality of gating controllers 40 may provide the same voltage, e.g., the read voltage Vrd, to the plurality of control gate electrodes Gc1 to Gcn at the same time.

The synapse 30a may have various polarization voltages Vp according to the remanent polarization of the ferroelectric films Ff1 to Ffn. That is, the synapse 30a may have various synaptic weighting levels, partially or overall.

The common floating gate electrode Gf may affect the conductivity or the resistance value of the synapse 30a according to the various polarization voltages Vp of the ferroelectric films Ff1 to Ffn. For example, the polarization voltages Vp of the ferroelectric films Ff1 to Ffn may differ from each other. The common floating gate electrode Gf may adjust a channel of the synapse 30a by averaging, or totaling, the polarization voltages Vp of the ferroelectric films Ff1 to Ffn. That is, the synapse 30a of the synapse array 100a in accordance with an embodiment of the present disclosure can have various contributions to synapse weight through a plurality of separate individual ferroelectric films Ff1 to Ffn, and can also output the total synapse weights (e.g., current) that is averaged over, or summed through, the common floating gate electrode (Gf).

FIG. 1C is a layout schematically illustrating the synapse array of the neuromorphic device shown in FIG. 1A. Referring to FIG. 1C, the synapse array 100a of the neuromorphic device in accordance with an embodiment of the present disclosure may include a plurality of active regions Act, a plurality of gate lines GL1 to GLn, a plurality of input neuron via plugs 10V, a plurality of output neuron via plugs 20V, and a plurality of gating via plugs 40V.

The plurality of active regions Act may extend in a first direction in parallel with each other. The plurality of gate lines GL1 to GLn may extend in a second direction. The plurality of input neuron via plugs 10V may be disposed on drain regions D of the plurality of active regions Act. The plurality of output neuron via plugs 20V may be disposed on source regions S of the plurality of active regions Act. The plurality of gating via plugs 40V may be disposed on end portions of the plurality of gate lines GL1 to GLn. The first direction and the second direction may be perpendicular to each other. That is, the plurality of active regions Act and the plurality of gate lines GL1 to GLn may extend in directions perpendicular to each other. In an example, the plurality of gate lines GL1 to GLn may correspond to the plurality of control gate electrodes Gc1 to Gcn or the plurality of gating control lines 41 shown in FIG. 1A or 1B.

Figure 1D:
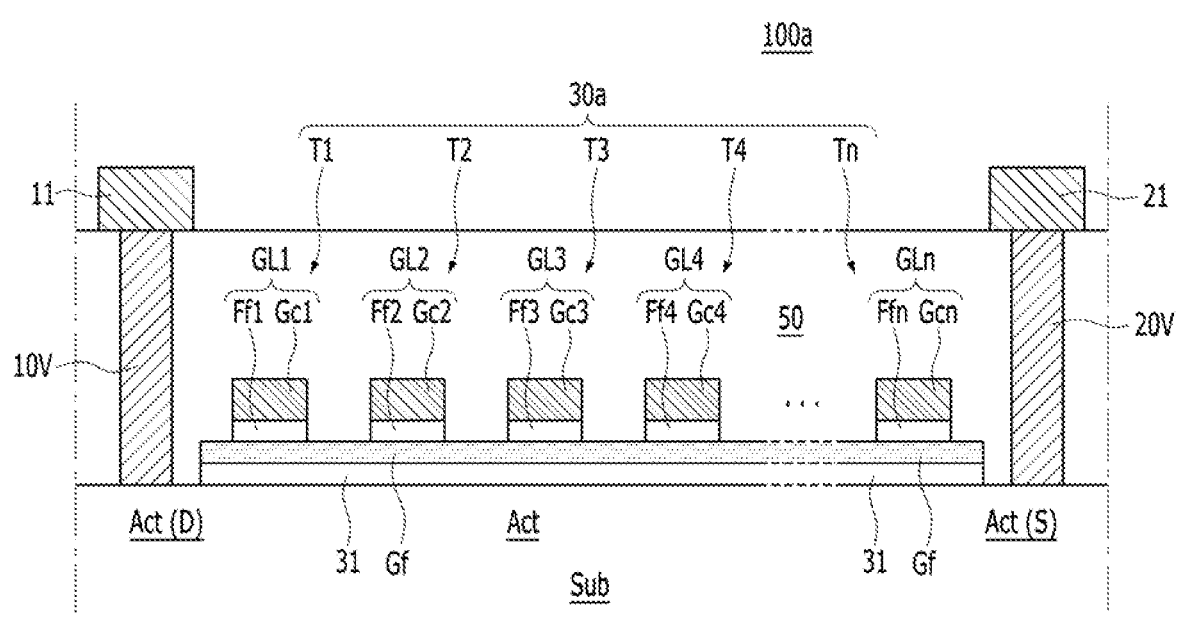
FIG. 1D schematically illustrates a longitudinal cross-sectional view of the synapse array of the neuromorphic device in accordance with an embodiment of the present disclosure taken along a line I-I' in FIG. 1C.

FIG. 1D schematically illustrates a longitudinal cross-sectional view of the synapse array of the neuromorphic device in accordance with an embodiment of the present disclosure taken along line I-I' in FIG. 1C. Referring to FIG. 1D, the synapse array 100a of the neuromorphic device in accordance with an embodiment of the present disclosure may include the synapse 30a disposed on the active region Act of a substrate Sub.

The synapse array 100a may include an interlayer insulating layer 50, an input neuron via plug 10V and an output neuron via plug 20V, and an input neuron line 11 and an output neuron line 21. The interlayer insulating layer 50 may cover the synapse 30a.

The input neuron via plug 10V and the output neuron via plug 20V may each vertically penetrate the interlayer insulating layer 50 and connect to the active region Act of the substrate Sub. The input neuron line 11 and the output neuron line 21 may be disposed on the interlayer insulating layer 50 and electrically connected to the input neuron via plug 10V and the output neuron via plug 20V, respectively.

The substrate Sub may include, for example, a bulk single-crystalline silicon layer or an epitaxially grown single-crystalline silicon layer. The interlayer insulating layer 50 may include an insulating material such as silicon oxide ($SiO_2$). The input neuron via plug 10V and the output neuron via plug 20V may include at least one of a doped poly-crystalline silicon, a metal silicide, a barrier metal layer, or a conductor such as a metal. The input neuron line 11 and the output neuron line 21 may include a barrier metal layer or a conductor such as a metal.

The synapse 30a may include a common gate insulating film 31, a common floating gate electrode Gf, individual ferroelectric films Ff1 to Ffn, and individual control gate electrodes Gc1 to Gcn. For example, the individual ferroelectric films Ff1 to Ffn and the individual control gate electrodes Gc1 to Gcn may share the common gate insulating film 31 and the common floating gate electrode Gf. The active region Act, the common gate insulating film 31, and the common floating gate electrode Gf may extend in the same direction, e.g., the first direction, and the individual ferroelectric films Ff1 to Ffn and the individual control gate electrodes Gc1 to Gcn may extend in the same direction, e.g., the second direction. The first direction and the second direction may be perpendicular to each other in a top or plan view.

The common gate insulating film 31 may include an insulating material such as, for example, silicon oxide ($SiO_2$) or silicon oxynitride (SiON). The common floating gate electrode Gf may include a poly-crystalline silicon layer doped with n-type ions such as phosphorus (P) or arsenic (As), as non-limiting examples. The individual ferroelectric films Ff1 to Ffn may include a ferroelectric material such as hafnium-oxide ($HfO_x$), as non-limiting examples. The individual control gate electrodes Gc1 to Gcn may include a conductor such as a barrier metal layer and/or a metal layer, as non-limiting examples. The barrier metal layer may include titanium-nitride (TiN), tantalum-nitride (TaN), or at least one of the other barrier materials, as non-limiting examples. The metal layer may include a metallic material such as tungsten (W), aluminum (Al), copper (Cu), or the other metals, as non-limiting examples.

Figure 2A:
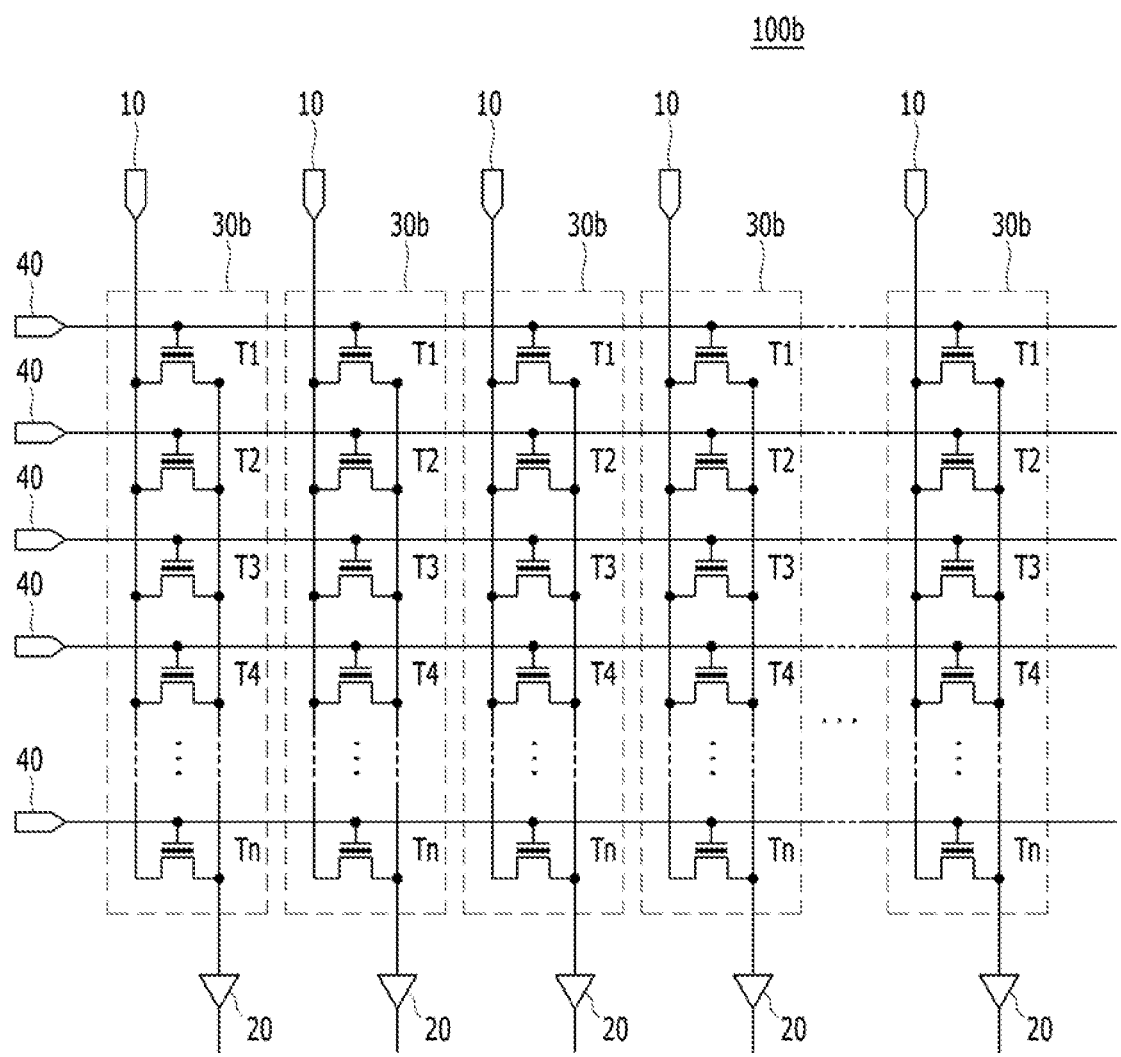
FIG. 2A is a diagram schematically illustrating a synapse array of a neuromorphic device in accordance with an embodiment of the present disclosure.
Figure 2B:
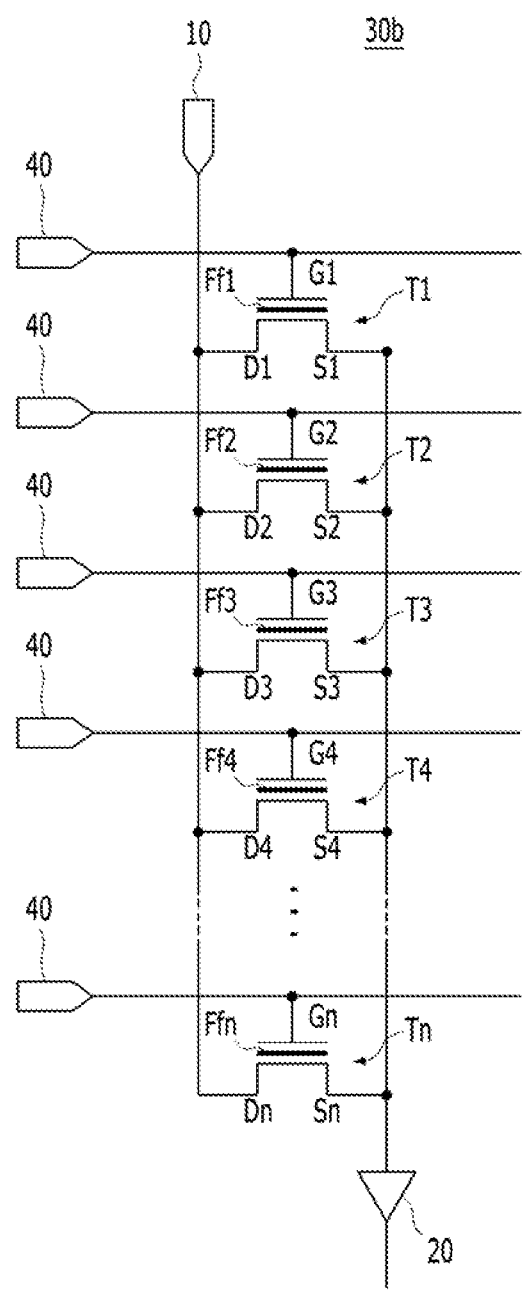
FIG. 2B is a diagram illustrating a synapse in accordance with the embodiment of the present disclosure.

FIG. 2A is a diagram schematically illustrating a synapse array of a neuromorphic device in accordance with an embodiment of the present disclosure, and FIG. 2B is a diagram illustrating a synapse in accordance with the embodiment of the present disclosure. Referring to FIGS. 2A and 2B, a synapse array 100b in accordance with an embodiment of the present disclosure may include a plurality of input neurons 10, a plurality of output neurons 20, a plurality of gating controllers 40, and a plurality of synapses 30b.

Referring to FIG. 2B, a synapse 30b may include a plurality of synapse transistors T1 to Tn connected in parallel. The synapse transistors T1 to Tn may include ferroelectric field effect transistors. Drain electrodes D1 to Dn of synapse transistors T1 to Tn may be electrically connected to a common input neuron 10 and source electrodes S1 to Sn may be electrically connected to a common output neuron 20. Gate electrodes G1 to Gn of the synapse transistors T1 to Tn may include ferroelectric films Ff1 to Ffn, respectively. Accordingly, the synapse transistors T1 to Tn may independently have various levels of synapse weights according to the polarization voltages of the ferroelectric films Ff1 to Ffn, respectively. Each of the gate electrodes G1 to Gn of the synapse transistors T1 to Tn may be electrically connected to different gating controllers 40, respectively. That is, the synapse transistors T1 to Tn may have independent and separate turn-on states and turn-off states. Therefore, a sum of the synapse weights of the synapse 30b may be determined in accordance with the turn-on states and the turn-off states of the synapse transistors T1 to Tn.

Figure 2C:
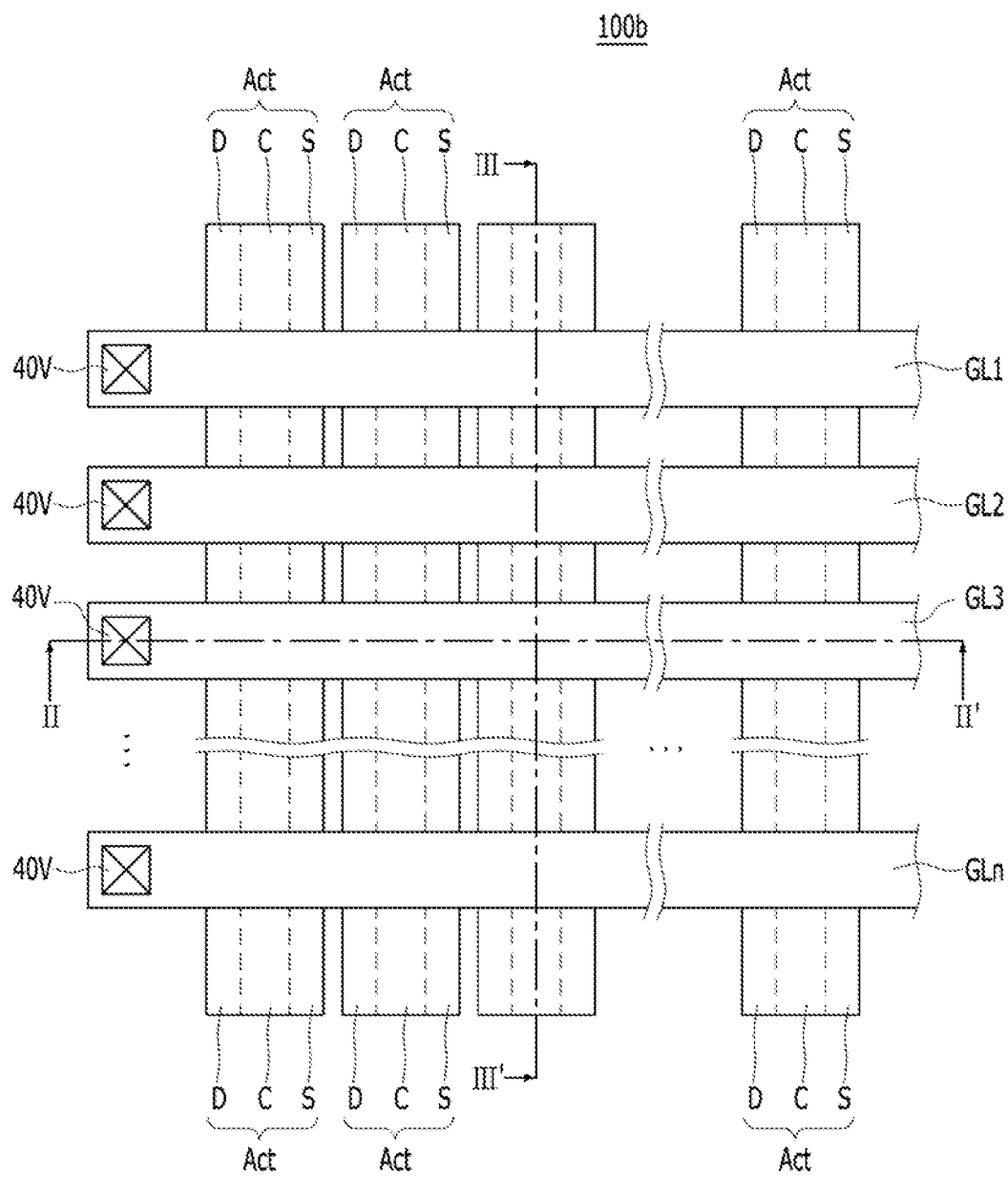
FIG. 2C is a layout schematically illustrating the synapse array shown in FIG. 2A.

FIG. 2C is a layout schematically illustrating the synapse array shown in FIG. 2A. Referring to FIG. 2C, the synapse array 100b of the neuromorphic device in accordance with an embodiment of the present disclosure may include a plurality of active regions Act and a plurality of gate lines GL1 to GLn.

The plurality of active regions Act may extend in parallel with each other in a first direction. The plurality of gate lines GL1 to GLn may extend in parallel with each other in a second direction. The plurality of active regions Act may include drain regions D, channel regions C, and source regions S extending in the first direction, respectively. The drain regions D and the source regions S of the active regions Act may be electrically connected to each other as a whole, in both the first and second directions, respectively. For example, the drain regions D and the source regions S may be electrically connected in a direction in which the gate lines GL1 to GLn extend, that is, in the second direction.

Figure 2D:
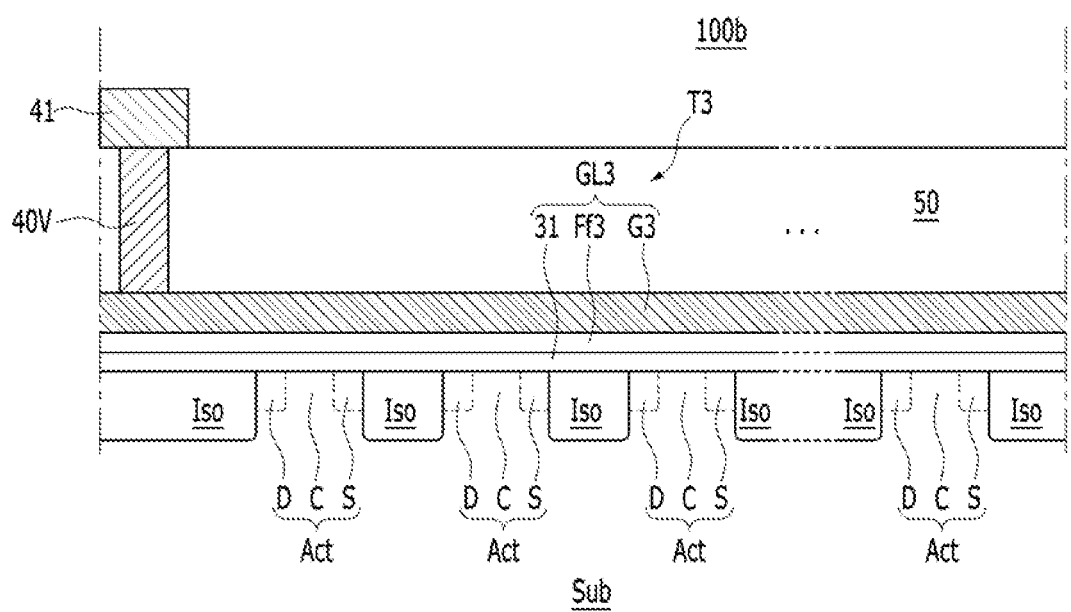
FIGS. 2D and 2E schematically illustrate longitudinal cross-sectional views taken along a line II-II' in FIG. 2C.
Figure 2E:
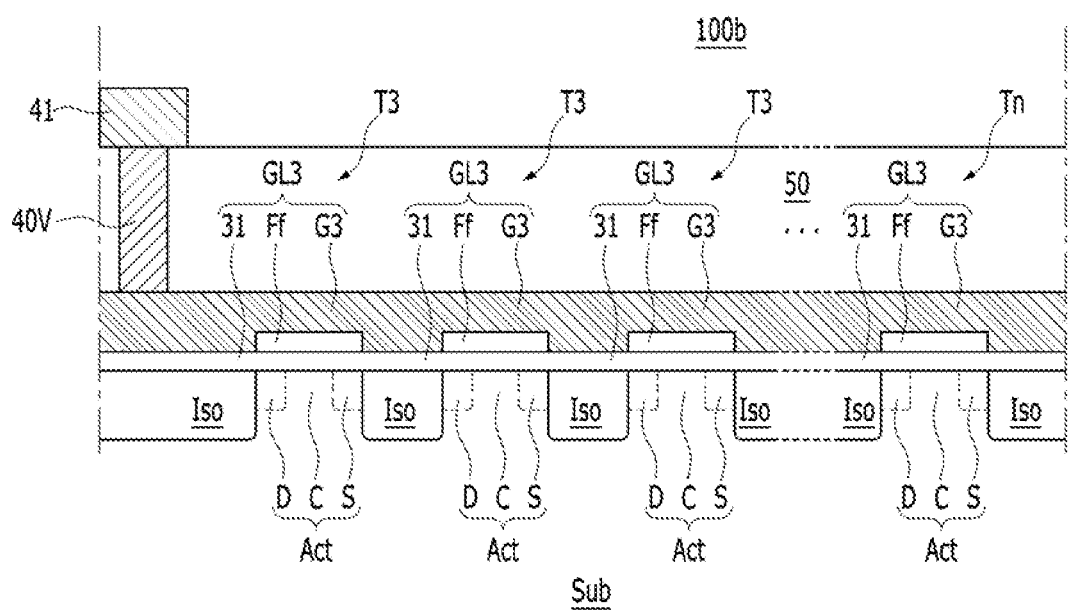
Figure 2F:
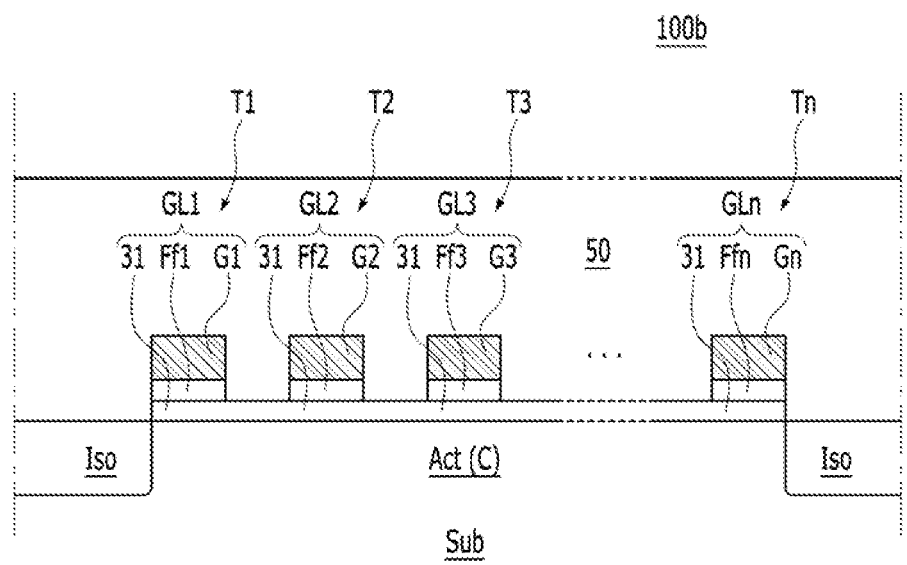
FIGS. 2F and 2G are cross-sectional views taken along a line III-III' in FIG. 2C.
Figure 2G:
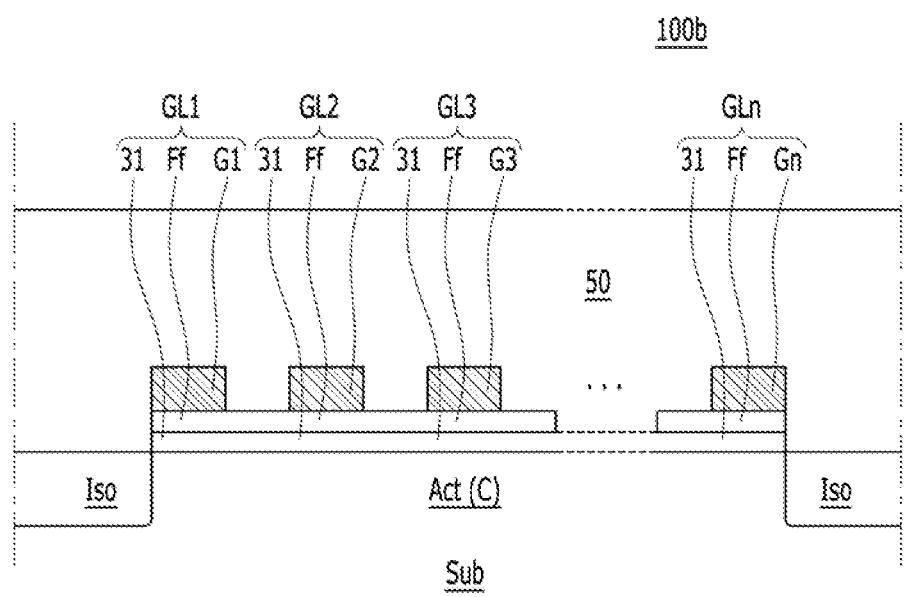

FIGS. 2D and 2E schematically illustrate longitudinal cross-sectional views taken along a line II-II' in FIG. 2C, and FIGS. 2F and 2G schematically illustrate cross-sectional views taken along a line III-III' in FIG. 2C.

Referring to FIGS. 2D, 2E, 2F and 2G, synapse arrays 100b in accordance with embodiments of the present disclosure may include a plurality of isolation regions Iso used to define a plurality of active regions Act, a plurality of gate lines GL1 to GLn, an interlayer insulating layer 50, a plurality of gating via plugs 40V, and a plurality of gating control lines 41. The isolation regions Iso and the active regions Act may be disposed in a substrate Sub and the gate lines GL1 to GLn, the interlayer insulating layer 50, the gating via plugs 40V, and the gating control lines 41 may be disposed on the substrate Sub.

Referring to FIGS. 2A, 2B, 2C, 2D, 2E, and 2F, in embodiments, each of the gate lines GL1 to GLn of the synapse transistors T1 to Tn may include a gate insulating film 31, ferroelectric insulating layers Ff1 to Ffn, and gate electrodes G1 to Gn, respectively, disposed on the substrate Sub.

Referring to FIGS. 2A, 2B, 2C, 2D, 2E and 2G, in other embodiments, the gate lines GL1 to GLn of the synapse transistors T1 to Tn of the synapse array 100b may include a common gate insulating film 31, a common ferroelectric film Ff, and individual gate electrodes G1 to Gn.

Referring to FIG. 2D, in an embodiment of the present disclosure, a gate insulating film 31, ferroelectric films Ff1 to Ffn, and gate electrodes G1 to Gn may extend in parallel with each other. Alternatively, in another embodiment of the present disclosure, the gate insulating film 31 and the ferroelectric films Ff1 to Ffn may have plate shapes, and the gate electrodes G1 to Gn may have line shapes. In an embodiment of the present disclosure, the gate insulating film 31 may extend in the same direction as the active region Act.

Referring to FIG. 2E, in an embodiment of the present disclosure, a ferroelectric film Ff and gate electrodes G1 to Gn may have line shapes that extend in directions perpendicular to each other. Alternatively, in another embodiment of the present disclosure, the ferroelectric film Ff may be independently disposed so as to be separated from each other, such as in an island type.

Referring to FIG. 2F, in an embodiment of the present disclosure, a gate insulating film 31 may have a plate shape, and ferroelectric films Ff1 to Ffn and gate electrodes G1 to Gn may have line shapes. That is, the ferroelectric films Ff1 to Ffn and the gate electrodes G1 to Gn may extend in the same direction.

Referring to FIG. 2G, in an embodiment of the present disclosure, a gate insulating film 31 and a ferroelectric film Ff may have a plate shape, and gate electrodes G1 to Gn may have line shapes. In another embodiment of the present disclosure, the ferroelectric film Ff may have a line shape extending in the first direction, and the gate electrodes G1 to Gn may have line shapes extending in the second direction.

Figure 3A:
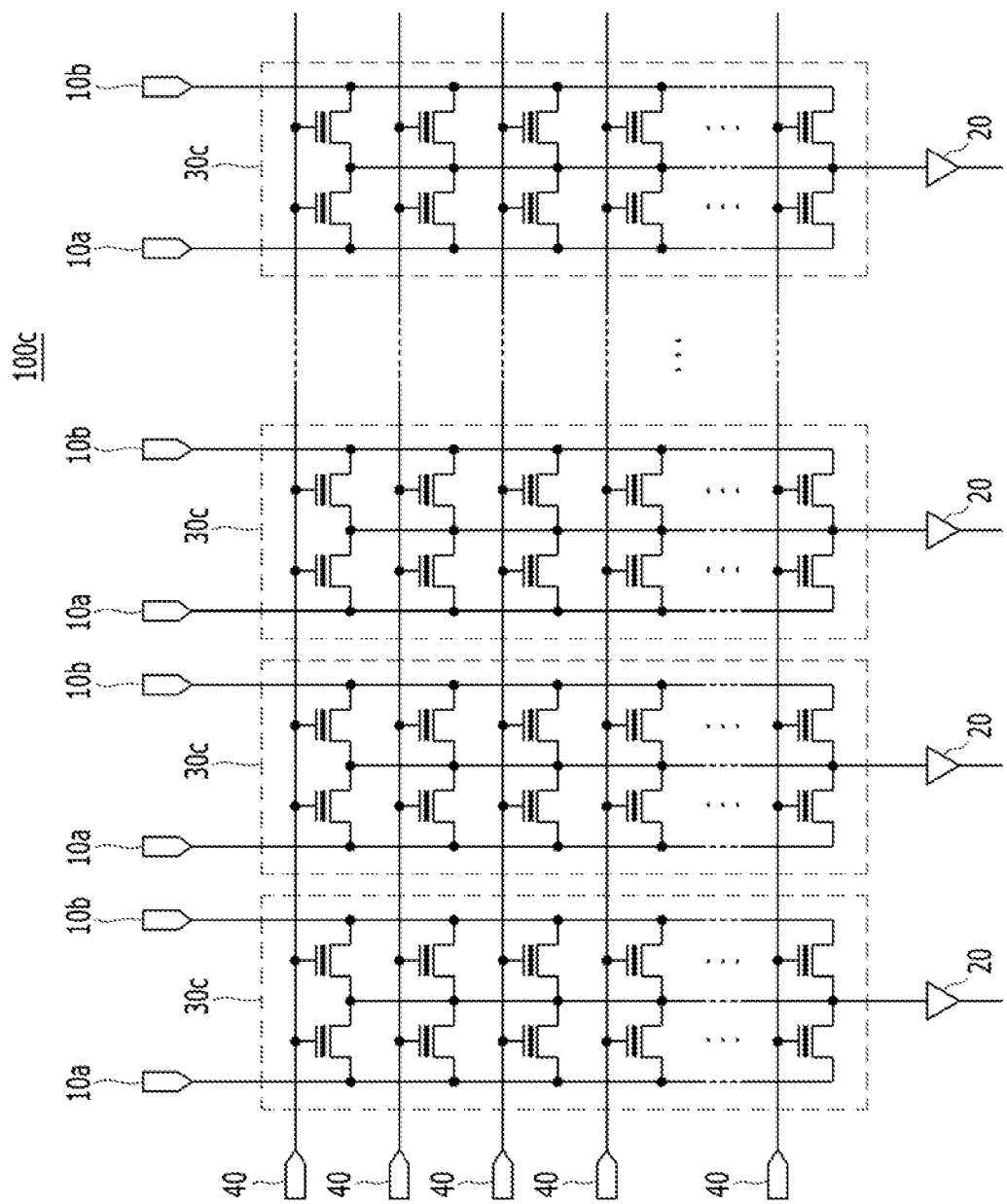
FIG. 3A is a diagram schematically illustrating a synapse array in accordance with an embodiment of the present disclosure.
Figure 3B:
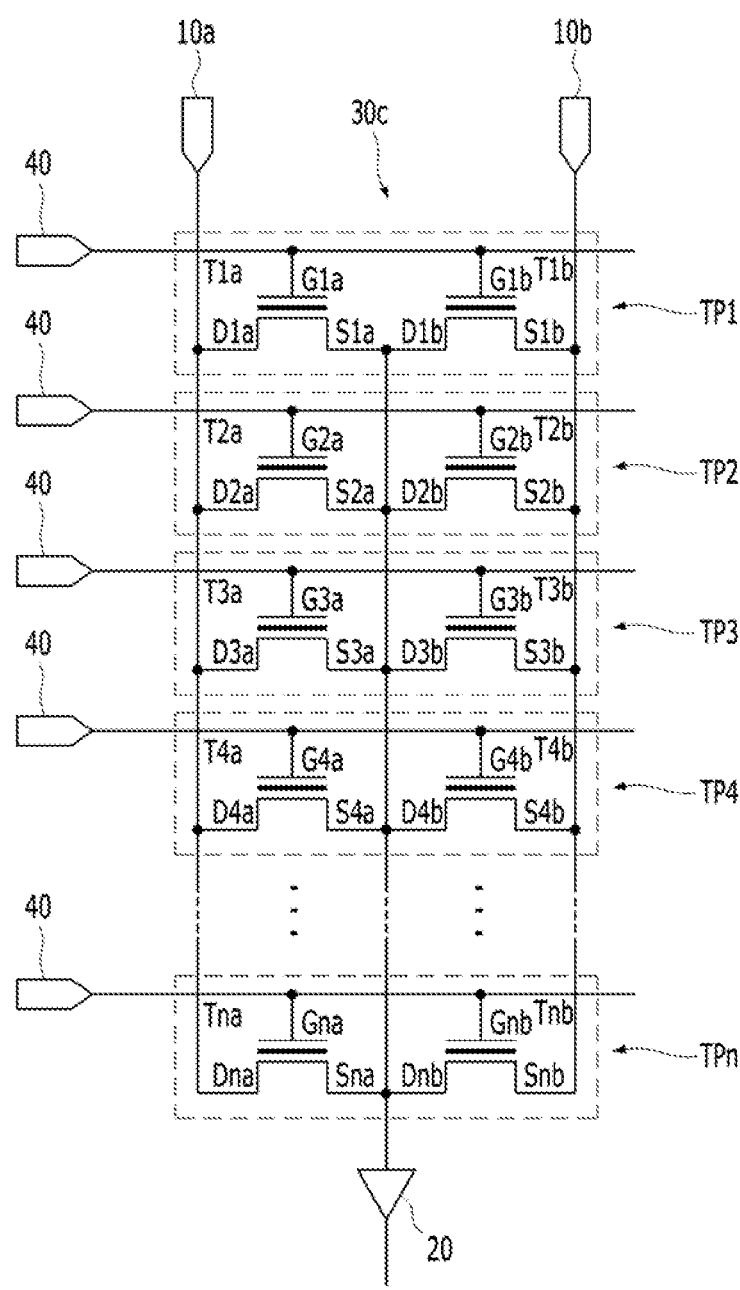
FIG. 3B is a diagram illustrating a synapse in accordance with an embodiment of the present disclosure.

FIG. 3A is a diagram schematically illustrating a synapse array in accordance with an embodiment of the present disclosure, and FIG. 3B is a diagram illustrating a synapse in accordance with an embodiment of the present disclosure.

Referring to FIGS. 3A and 3B, a synapse array 100c in accordance with an embodiment of the present disclosure may include a plurality of first input neurons 10a, a plurality of second input neurons 10b, a plurality of output neurons 20, a plurality of gating controllers 40, and a plurality of synapses 30c.

Each of the plurality of synapses 30c may include a plurality of pairs of synapse transistors TP1 to TPn connected in parallel with each other. The pairs of the synapse transistors TP1 to TPn may include a plurality of first transistors T1a to Tna and a plurality of second transistors T1b to Tnb connected in series, respectively. Referring to FIG. 3B, in the synapse 30c, drain electrodes D1a to Dna of the first transistors T1a to Tna may be connected to a common first input neuron 10a, and source electrodes S1b to Snb of the second transistors T1b to Tnb may be connected to a common second input neuron 10b, and source electrodes S1a to Sna of the first transistors T1a to Tna and drain electrodes D1b to Dnb of the second transistors T1b to Tnb may be directly electrically connected to each other and connected to a common output neuron 20, respectively.

Furthermore, gate electrodes G1a to Gna of the first transistors T1a to Tna and gate electrodes G1b to Gnb of the second transistors T1b to Tnb are directly electrically connected to each other and connected to the gating controllers 40, respectively.

The first input neurons 10a may provide a first reference voltage to the drain electrodes D1a to Dna of the first transistors T1a to Tna of synapse 30c. For example, the first input neuron 10a may be connected to a power supply voltage node, and the first reference voltage may be a power supply voltage.

The second input neurons 10b may provide a second reference voltage to the source electrodes S1b to Snb of the second transistors T1b to Tnb of the synapse 30c. For example, the second input neurons 10b may be coupled to a ground voltage node, and the second reference voltage may be a ground voltage. The first reference voltage may be relatively higher or greater than the second reference voltage.

Figure 3C:
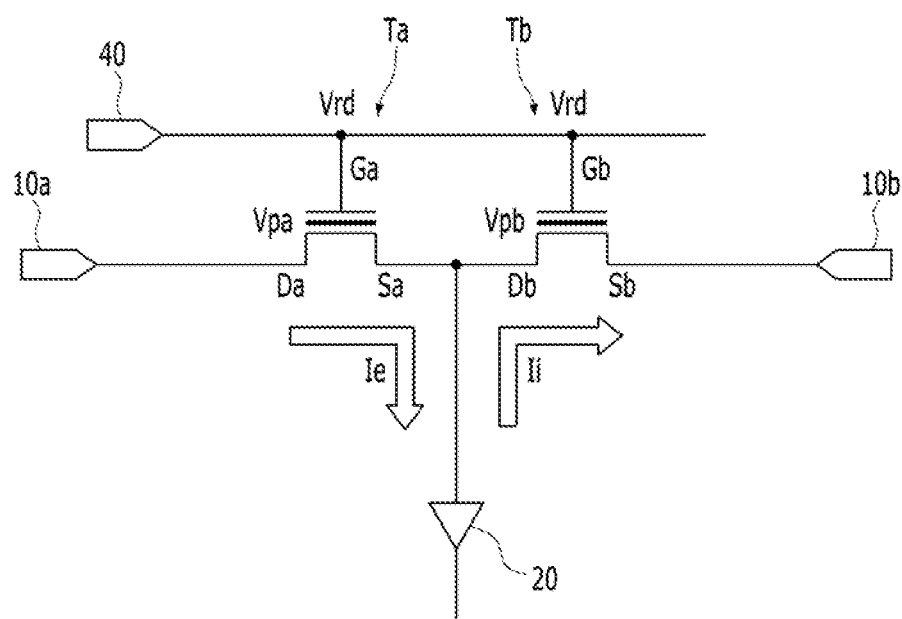
FIG. 3C is a schematic diagram showing a synaptic operation of a pair of the synapse transistors of a synapse in accordance with an embodiment of the present disclosure.

FIG. 3C is a schematic diagram showing a synaptic operation of a pair of the synapse transistors of a synapse in accordance with an embodiment of the present disclosure. Referring to FIG. 3C, a pair of the synapse transistors Ta and Tb of a synapse 30c in accordance with an embodiment of the present disclosure can execute or operate an excitatory synapse operation and/or an inhibitory synapse operation according to polarization voltages Vpa and Vpb of gate electrodes Ga and Gb of the transistors Ta and Tb. For example, when the read voltage Vrd is applied to the gate electrodes Ga and Gb of the transistors Ta and Tb from the gating controller 40, depending on the polarization voltages Vpa and Vb of the gate electrode Ga and Gb of the transistors Ta and Tb, the first transistor Ta allows an excitatory synapse current Ie to conduct from the first input neuron 10a to the output neuron 20, and the second transistor Tb allows an inhibitory synapse current Ii to conduct from the output neuron 20 to the second input neuron 10b.

The excitatory synapse current Ie may be an excitatory synapse operation that increases current to the output neuron 20 to potentiate the synaptic weight, and the inhibitory synapse current Ii may be an inhibitory synapse operation that decreases current from the output neuron 20 to depress the synaptic weight. In another example, if the read voltage Vrd is zero volts (0V) and the polarization voltage Vpb of the second transistor Tb is greater than the polarization voltage Vpa of the first transistor Ta, the inhibitory synapse current Ii may be greater than the excitatory synapse current Ie so that the pair of the synapse transistors Ta and Tb can perform an inhibitory synapse operation as a whole. Thus, the pair of the synapse transistors Ta and Tb can selectively perform either an excitatory synapse operation or an inhibitory synapse operation depending on the polarization voltages Vpa and Vpb of the gate electrodes Ga and Gb of the transistors Ta and Tb.

Figure 3D:
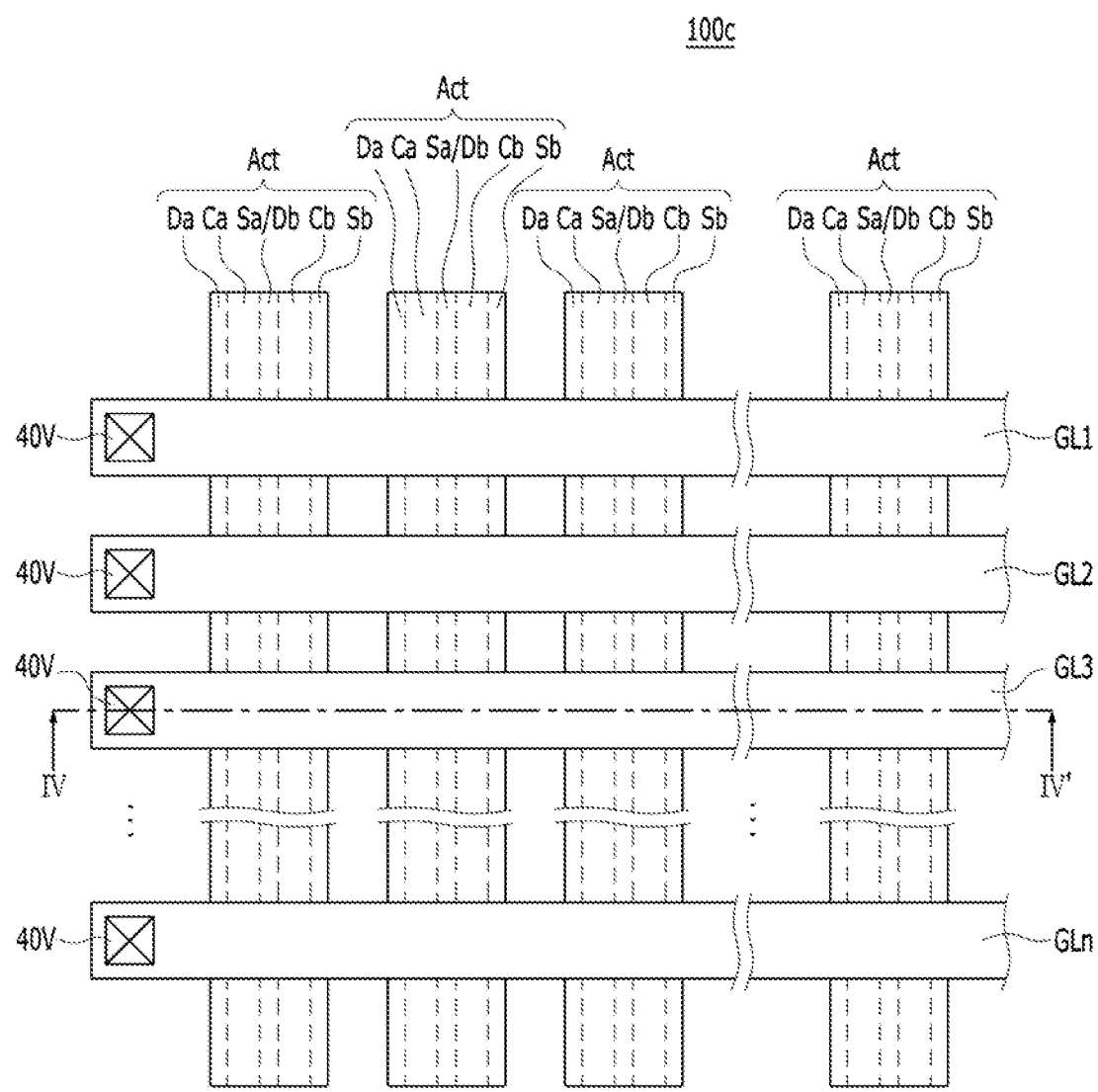
FIG. 3D is a layout schematically illustrating the synapse array shown in FIG. 3A.

FIG. 3D is a layout schematically illustrating the synapse array shown in FIG. 3A. Referring to FIG. 3D, the synapse array 100c of the neuromorphic device in accordance with the embodiment of the present disclosure may include a plurality of active regions Act and a plurality of gate lines GL1 to GLn.

The plurality of active regions Act may extend in parallel with each other in a first direction. The plurality of gate lines GL1 to GLn may extend in parallel with each other in a second direction. Each of the active regions Act may include a first drain region Da, a first channel region Ca, a first source region Sa, a second drain region Db, a second channel region Cb, and a second source region Sb. The first source region Sa and the second drain region Db may be one shared region in common. The first drain regions Da, the first channel regions Ca, the first source region Sa, the second drain region Db, the second channel regions Cb, and the second source regions Sb may overlap and intersect with the gate lines GL1 to GLn. The first drain region Da, the first channel region Ca, and the first source region Sa may constitute the first transistors T1a to Tna shown in FIGS. 3A to 3C. The second drain region Db, the second channel region Cb, and the second source region Sb may constitute the second transistors T1b to Tnb shown in FIGS. 3A to 3C.

Figure 3E:
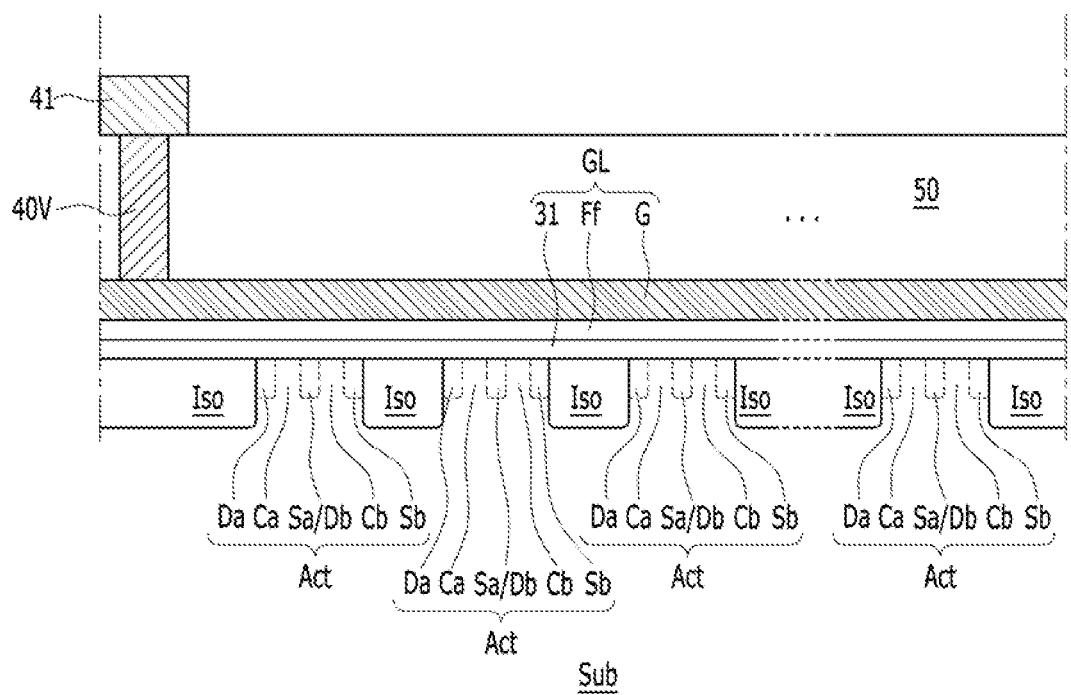
FIGS. 3E and 3F schematically illustrate longitudinal cross-sectional views of a synapse array in accordance with embodiments of the present disclosure taken along a line IV-IV' in FIG. 3D.
Figure 3F:
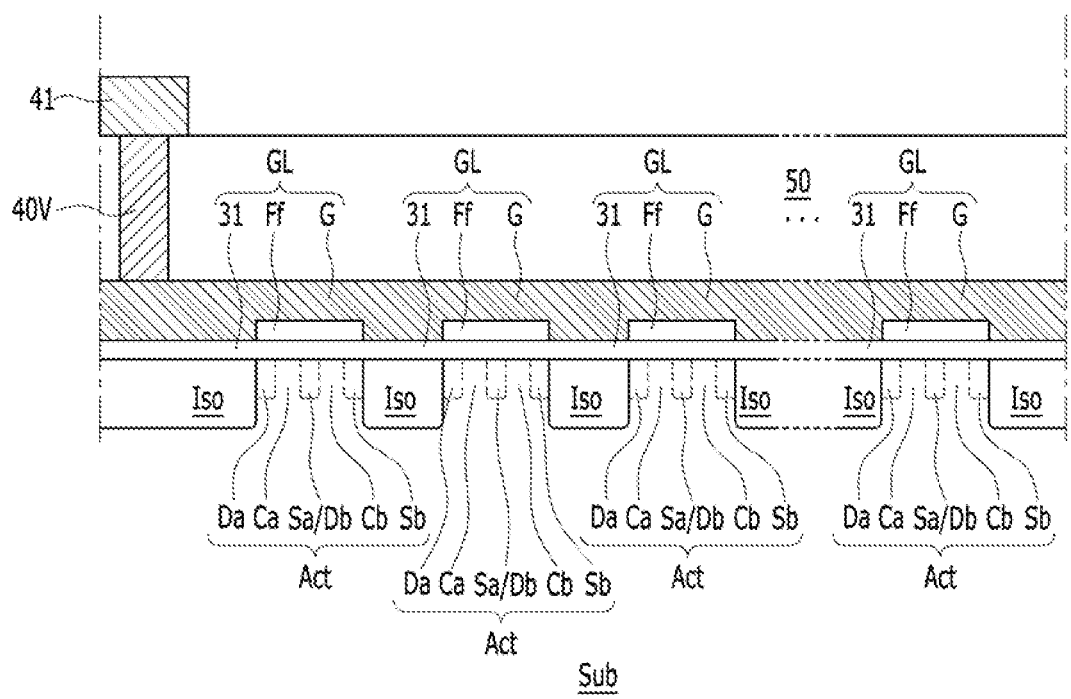

FIGS. 3E and 3F schematically illustrate longitudinal cross-sectional views of a synapse array in accordance with embodiments of the present disclosure taken along a line IV-IV' in FIG. 3D. Referring to FIGS. 3E and 3F, a synapse array 100c in accordance with an embodiment of the present disclosure may include isolation regions Iso, a gate line GL, an interlayer insulating layer 50, a gating via plug 40V, and a gating control line 41.

The isolation regions Iso may define active regions Act. The isolation regions Iso and the active regions Act may be disposed in a substrate Sub. The gate line GL, the interlayer insulating layer 50, the gating via plug 40V, and the gating control line 41 may be disposed on the substrate Sub. The gate line GL may include a gate insulating film 31, a ferroelectric film Ff, and a gate electrode G.

Referring to FIG. 3E, in an embodiment of the present disclosure, the gate insulating film 31, the ferroelectric film Ff, and the gate electrode G may be a line shape crossing the active regions Act. Alternatively, in another embodiment of the present disclosure, the gate insulating film 31 and the ferroelectric film Ff may be a plate shape, and the gate electrode G may have a line shape.

Referring to FIG. 3F, in an embodiment of the present disclosure, the ferroelectric film Ff and the gate electrode G may be line shapes extending in directions perpendicular to each other. Alternatively, in another embodiment of the present disclosure, the ferroelectric film Ff may be independently disposed so as to be separated from each other, such as in an island type. In an embodiment of the present disclosure, the gate insulating film 31 may be a plate shape, and the ferroelectric film Ff and the gate electrode G may be line shapes. That is, the ferroelectric film Ff and the gate electrode G may extend in directions perpendicular to each other.

Figure 4A:
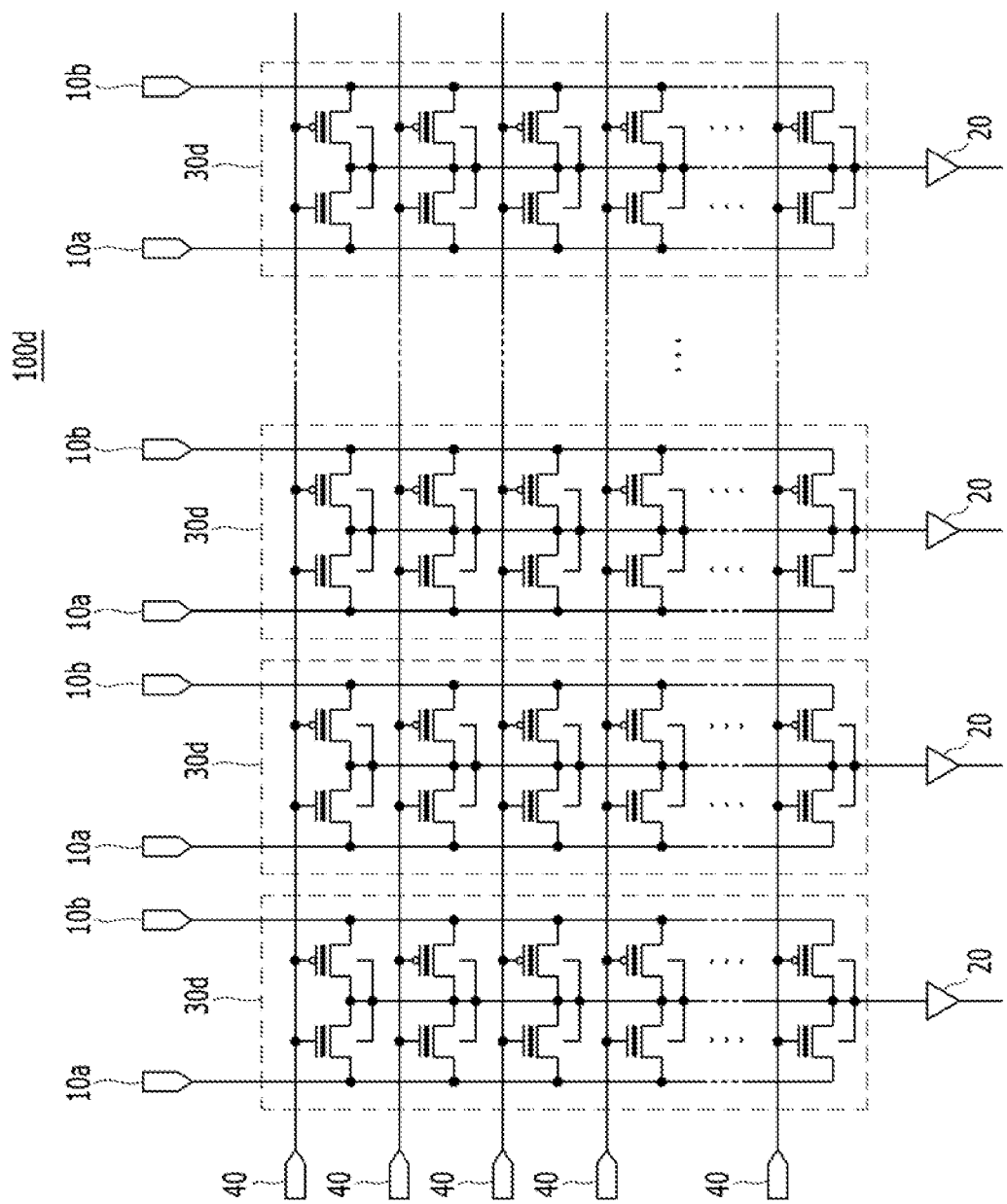
FIG. 4A is a diagram schematically illustrating a synapse array in accordance with an embodiment of the present disclosure.
Figure 4B:
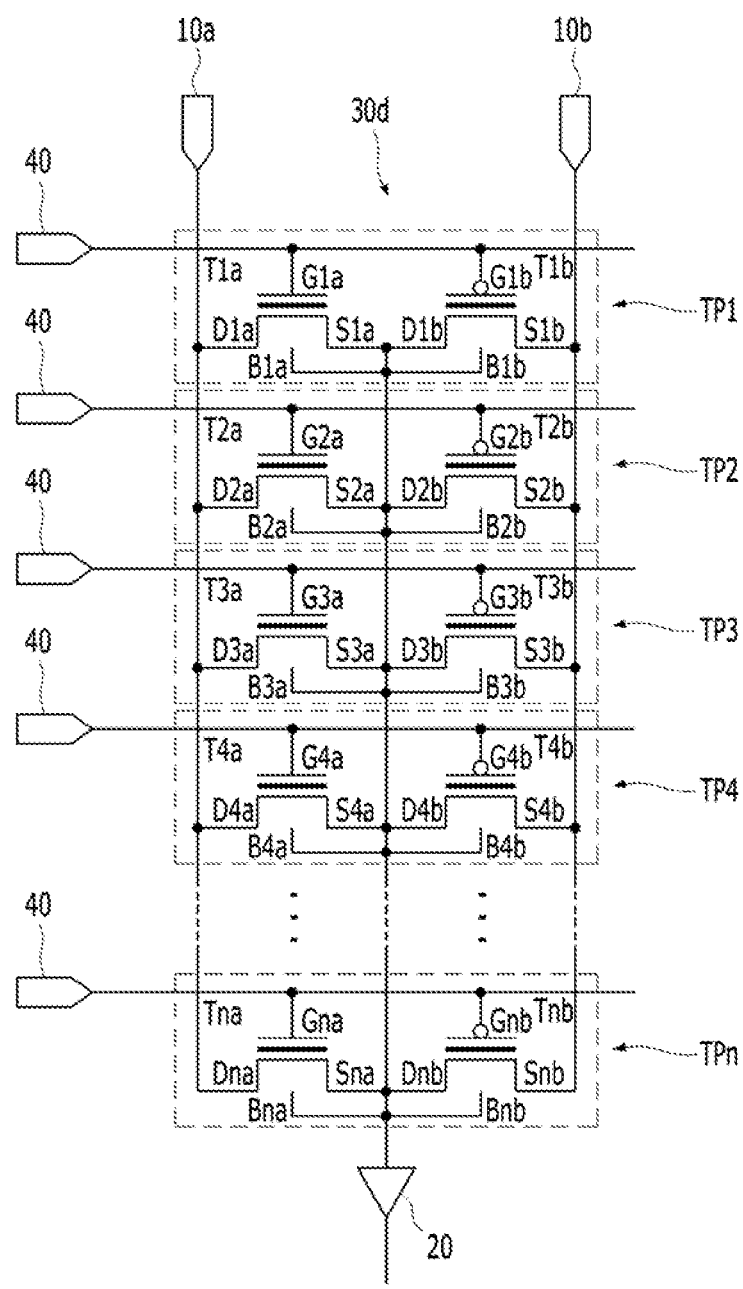
FIG. 4B is a schematic diagram illustrating a synapse in accordance with the embodiment of the present disclosure.

FIG. 4A is a diagram schematically illustrating a synapse array in accordance with an embodiment of the present disclosure, and FIG. 4B is a schematic diagram illustrating a synapse in accordance with the embodiment of the present disclosure. Referring to FIGS. 4A and 4B, a synapse array 100d in accordance with an embodiment of the present disclosure may include a plurality of first input neurons 10a, a plurality of second input neurons 10b, a plurality of output neurons 20, a plurality of gating controllers 40, and a plurality of synapses 30d.

Each of the synapses 30d may include a plurality of pairs of synapse transistors TP1 to TPn connected in parallel. The pairs of synapse transistors TP1 to TPn may include first transistors T1a to Tna and second transistors T1b to Tnb connected in series, respectively. Referring to FIG. 4B, in a synapse 30d, drain electrodes D1a to Dna of the first transistors T1a to Tna may be connected to a common first input neuron 10a, source electrodes S1b to Snb of the second transistors T1b to Tnb may be connected to a common second input neuron 10b, and source electrodes S1a to Sna of the first transistors T1a to Tna and the drain electrodes D1b to Dnb of the second transistors T1b to Tnb may be directly electrically connected to each other and connected to a common output neuron 20, respectively.

The gate electrodes G1a to Gna of the first transistors T1a to Tna and the gate electrodes G1b to Gnb of the second transistors T1b to Tnb may be directly electrically connected to a plurality of gating controllers 40, respectively.

The first input neuron 10a may provide a first reference voltage to the drain electrodes D1a to Dna of the first transistors T1a to Tna of the synapse 30d. For example, the first input neuron 10a may be coupled to the power supply voltage node, and the first reference voltage may be the power supply voltage.

The second input neuron 10b may provide the second reference voltage to the source electrodes S1b to Snb of the second transistors T1b to Tnb of the synapse 30d. For example, the second input neuron 10b may be coupled to a ground voltage node, and the second reference voltage may be a ground voltage. The first reference voltage may be higher or greater than the second reference voltage.

Figure 5:
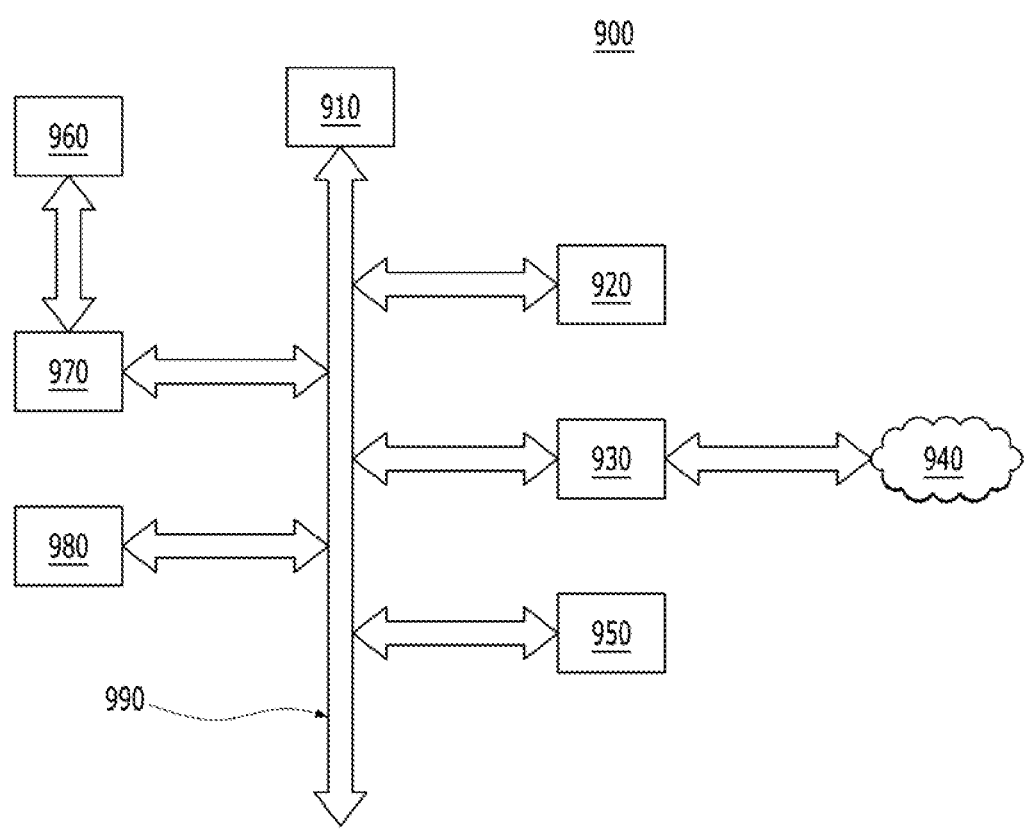
FIG. 5 is a diagram schematically illustrating a pattern recognition system in accordance with an embodiment of the present disclosure.

FIG. 5 is a diagram schematically illustrating a pattern recognition system in accordance with an embodiment of the present disclosure. For example, a pattern recognition system 900 may include a speech recognition system, an imaging recognition system, a code recognition system, a signal recognition system, and one or more systems for recognizing various patterns.

Referring to FIG. 5, the pattern recognition system 900 in accordance with the embodiment of the present disclosure may include a Central Processing Unit (CPU) 910, a memory unit 920, a communication control unit 930, a network 940, an output unit 950, an input unit 960, an Analog-Digital Converter (ADC) 970, a neuromorphic unit 980, and/or a bus 990. The CPU 910 may generate and transmit various signals for a learning process of the neuromorphic unit 980, and perform various processes and functions for recognizing patterns according to an output from the neuromorphic unit 980. For example, the CPU 910 may perform processes and functions for recognizing speech and imaging patterns based on an output from the neuromorphic unit 980.

The CPU 910 may be connected with the memory unit 920, the communication control unit 930, the output unit 950, the ADC 970, and the neuromorphic unit 980 through the bus 990.

The memory unit 920 may store various pieces of information, which are required to be stored in the pattern recognition system 900. The memory unit 920 may include one or more of a volatile memory device, such as DRAM or SRAM, a nonvolatile memory, such as PRAM, MRAM, ReRAM or NAND flash memory, and various memory units, such as Hard Disk Drive (HDD) and Solid State Drive (SSD).

The communication control unit 930 may transmit and/or receive data to and/or from a communication control unit of another system through the network 940. For example, the communication control unit 930 may transmit speech and/or image recognition data through the network 940.

The output unit 950 may output data in various manners. For example, the output unit 950 may include a speaker, a printer, a monitor, a display panel, a beam projector, a hologrammer, or other various output devices. The output unit 950 may output, for example, speech and/or image recognition data.

The input unit 960 may include any of a microphone, a camera, a scanner, a touch pad, a keyboard, a mouse, a mouse pen, and one or more of various sensors.

The ADC 970 may convert analog data inputted from the input unit 960 into digital data.

The neuromorphic unit 980 may perform learning or recognition using the data outputted from the ADC 970, and output data corresponding to recognized patterns. The neuromorphic unit 980 may include one or more of the neuromorphic devices in accordance with the various embodiments described above.

In accordance with embodiments of the present disclosure, the synapse arrays of a neuromorphic device including ferroelectric field effect transistors can have a higher degree of integration, a lower power consumption, and multiple resistance levels.

Although various embodiments have been described for illustrative purposes, it will be apparent to those skilled in the art that various changes and modifications may be made without departing from the spirit and scope of the disclosure, as defined in the following claims.

What is claimed is:

1. A synapse array of a neuromorphic device comprising:
a plurality of input neurons;
a plurality of output neurons;
a plurality of gating controllers; and
a plurality of synapses,
wherein:
the plurality of synapses comprises a first synapse, a second synapse and a third synapse arrayed in a first direction;
each of the first to third synapses comprises a first ferroelectric field effect transistor, a second ferroelectric field effect transistor, and a third ferroelectric field effect transistor arrayed in a second direction, which is perpendicular to the first direction;
the first to third ferroelectric field effect transistors of the first synapse are electrically connected to each other in parallel, the first to third ferroelectric field effect transistors of the second synapse are electrically connected to each other in parallel and the first to third ferroelectric field effect transistors of the third synapse are electrically connected to each other in parallel;
each of the first ferroelectric field effect transistors, the second ferroelectric field effect transistors and the third ferroelectric field effect transistors comprises a gate insulating layer, a ferroelectric film, and a gate electrode; and
the gate electrode of the first ferroelectric field effect transistor of the first synapse, the gate electrode of the first ferroelectric field effect transistor of the second synapse and the gate electrode of the first ferroelectric field effect transistor of the third synapse are electrically connected to each other.

2. The synapse array of the neuromorphic device of claim 1,
wherein:
the ferroelectric films of the first ferroelectric field effect transistors of the first, second and third synapses are line shapes that extend in the first direction to directly connect with each other; and
the gate electrodes of the first ferroelectric field effect transistors of the first, second and third synapses are line shapes that extend in the first direction to directly connect with each other.

3. The synapse array of the neuromorphic device of claim 1,
wherein:
the ferroelectric films of the first, second and third ferroelectric field effect transistors in a synapse are line shapes that extend in the second direction to directly connect with each other;
the gate electrodes of the first ferroelectric field effect transistors of the first, second and third synapses are line shapes that extend in the first direction to directly connect with each other.

4. The synapse array of the neuromorphic device of claim 1,
wherein:
each of the gate insulating layers has a plate shape that extends in the first direction and the second direction to directly connect with each other;
each of the ferroelectric films has a plate shape that extends in the first direction and the second direction to directly connect with each other; and
the gate electrodes of the first ferroelectric field effect transistors of the first, second and third synapses are line shapes that extend in the first direction to directly connect with each other.

5. The synapse array of the neuromorphic device of claim 1,
wherein each of the first ferroelectric field effect transistors, the second ferroelectric field effect transistors, and the third ferroelectric field effect transistors includes a drain electrode electrically connected to the input neurons.

6. The synapse array of the neuromorphic device of claim 1,
wherein each of the first ferroelectric field effect transistors, the second ferroelectric field effect transistors, and the third ferroelectric field effect transistors includes a source electrode electrically connected to the output neurons.

7. The synapse array of the neuromorphic device of claim 1, wherein each of the gate electrodes of the first ferroelectric field effect transistors, the second ferroelectric field effect transistors, and the third ferroelectric field effect transistors is electrically connected to the gating controllers.

8. A synapse array of a neuromorphic device comprising:
an input neuron;
an output neuron;
a plurality of gating controllers; and
a synapse,
wherein:
the synapse comprises a ferroelectric field effect transistor having a common gate insulating layer, a common floating gate electrode, a plurality of individual ferroelectric films, and a plurality of individual control gate electrodes,
the plurality of individual ferroelectric films and the plurality of individual control gate electrodes share the common floating gate electrode, and
the plurality of gating controllers are electrically connected to the plurality of individual control gate electrodes, respectively.

9. The synapse array of the neuromorphic device of claim 8,
wherein the ferroelectric field effect transistor includes a drain electrode electrically connected to the input neuron and
a source electrode electrically connected to the output neuron.

10. The synapse array of the neuromorphic device of claim 2, wherein:
the ferroelectric films of the second ferroelectric field effect transistors of the first, second and third synapses are line shapes that extend in the first direction to directly connect with each other;
the ferroelectric films of the third ferroelectric field effect transistors of the first, second and third synapses are line shapes that extend in the first direction to directly connect with each other;
the gate electrodes of the second ferroelectric field effect transistors of the first, second and third synapses are line shapes that extend in the first direction to directly connect with each other; and
the gate electrodes of the third ferroelectric field effect transistors of the first, second and third synapses are line shapes that extend in the first direction to directly connect with each other.

11. The synapse array of the neuromorphic device of claim 1, wherein channel sizes of the first, second and third ferroelectric field effect transistors vary according to polarization voltages of the respective ferroelectric films.

12. The synapse array of the neuromorphic device of claim 8, wherein the plurality of individual ferroelectric films and the plurality of individual control gate electrodes are line shapes extending in a same direction.

13. The synapse array of the neuromorphic device of claim 8, wherein the plurality of individual ferroelectric films and the plurality of individual control gate electrodes are line shapes extending in directions perpendicular to each other.

14. The synapse array of the neuromorphic device of claim 8, wherein the common gate insulating layer and the plurality of individual ferroelectric films have a plate shape, and the plurality of individual control gate electrodes are line shapes.

15. The synapse array of the neuromorphic device of claim 8, wherein channel size of the ferroelectric field effect transistor varies according to polarization voltages of the individual ferroelectric films.

* * * * *